United States Patent [19]
Shiozawa

[11] Patent Number: 5,394,418
[45] Date of Patent: Feb. 28, 1995

[54] WAVELENGTH SWITCHING LIGHT SOURCE

[75] Inventor: Takahiro Shiozawa, Tokyo, Japan

[73] Assignee: NEC Corporation, Tokyo, Japan

[21] Appl. No.: 147,643

[22] Filed: Nov. 4, 1993

[30] Foreign Application Priority Data
  Nov. 4, 1992 [JP] Japan .................................. 4-295036

[51] Int. Cl.6 ............................................. H01S 3/00
[52] U.S. Cl. ........................................ 372/38; 372/32
[58] Field of Search ........................... 372/38, 2 L, 32

[56] References Cited

PUBLICATIONS

Conference on Optical Fiber Communication/International Conference on Integrated Optics and Optical Fiber Communication, 1993 Technical Digest Series, vol. 4, Conference Edition, Feb. 21–26, 1993, San Jose, Calif., "Wavelength–Addressed Optical Network Using an ATM Cell–Based Access Scheme", pp. 49–50.

*Primary Examiner*—Léon Scott, Jr.
*Attorney, Agent, or Firm*—Ostrolenk, Faber, Gerb & Soffen

[57] ABSTRACT

The output light of a variable-wavelength light source 101 is brought to incidence on an optical resonator 103 having a periodic transmitting characteristic, and the transmitted light is detected by an optical intensity detector 105 and, having the difference from a reference level as the error signal, fed back by an operational amplifier 106 to the variable-wavelength light source 101. Therefore the output light frequency of the variable-wavelength light source 101 is stabilized at the shoulder of the peak of the transmitting characteristic (the point where the transmittance varies) of the optical resonator 103. Wavelength switching is accomplished by selecting one out of two variable current sources built into a wavelength control circuit 108. This variable current source switching forcibly shifts the stabilization point to the shoulder of the peak of another transmittance of the optical resonator 103. Upon supply of a wavelength designation signal 100-2 from outside, the output current value of the variable current source which is at present in a stand-by state is set at a value corresponding to the designated wavelength.

7 Claims, 3 Drawing Sheets

WAVELENGTH SWITCHING LIGHT SOURCE

BACKGROUND OF THE INVENTION

The present invention relates to a wavelength switching light source for use in optical communication systems and the like, and more particularly to a wavelength switching light source capable of high-speed switching of the wavelength of output light.

Known examples of optical communication system requiring high-speed switching of the wavelength of output light include, for instance, the optical packet transfer network described in "Wavelength-addressed optical network using an ATM cell-based access scheme" (by N. Shimosaka et al.), Conference on Optical Fiber Communication/International Conference on Integrated Optics and Optical Fiber Communication, Technical Digest Series, Volume 4 (1993), pp. 49–50.

In this system, the wavelength of the light source should be switched and the altered wavelength should be stabilized within the guard time left between consecutive packets. To meet this need, the arrangement described in this literature uses a variable-wavelength light source consisting of two semiconductor lasers and an optical switch for selectively supplying the output light of one or the other of the two semiconductor lasers.

Incidentally, whereas the oscillation wavelength of a semiconductor laser varies with temperature fluctuations and accordingly these temperature fluctuations should be compensated for, the variable-wavelength light source described in this literature requires either a temperature compensation circuit for each semiconductor laser or a constant temperature device accommodating a plurality of semiconductor lasers, and entails the problem that the dimensions of the variable-wavelength light source would increase with the number of wavelengths used.

SUMMARY OF THE INVENTION

The object of the present invention is to provide a variable-wavelength light source whose dimensions will hardly enlarge even if a wavelength range used increases.

According to the invention, there is provided a wavelength switching light source for varying the wavelength of the output light in accordance with a wavelength designating signal and a wavelength switching signal, both supplied from outside, comprising:

a variable-wavelength light source whose oscillating wavelength varies in accordance with a wavelength control signal;

a light brancher for branching the output light of said variable-length light source into two beams, of which one is supplied externally as an output light and the other is brought to incidence on an optical resonator;

said optical resonator having a periodic wavelength transmitting characteristic;

an optical detector for detecting the power of the output light of said optical resonator and outputting a value corresponding to this power;

Means for outputting a first wavelength control signal which is proportional to the balance of the subtraction of said optical detector output value from a fixed value;

wavelength control means for outputting a second wavelength control signal required for oscillating said optical-wavelength light source at a designated wavelength in accordance with said wavelength designation signal and said wavelength switching signal; and adder means for adding said first wavelength control signal and said second wavelength control signal to output said wavelength control signal.

DETAILED DESCRIPTION OF THE PREFERRED EMBODIMENT

Figure 1:
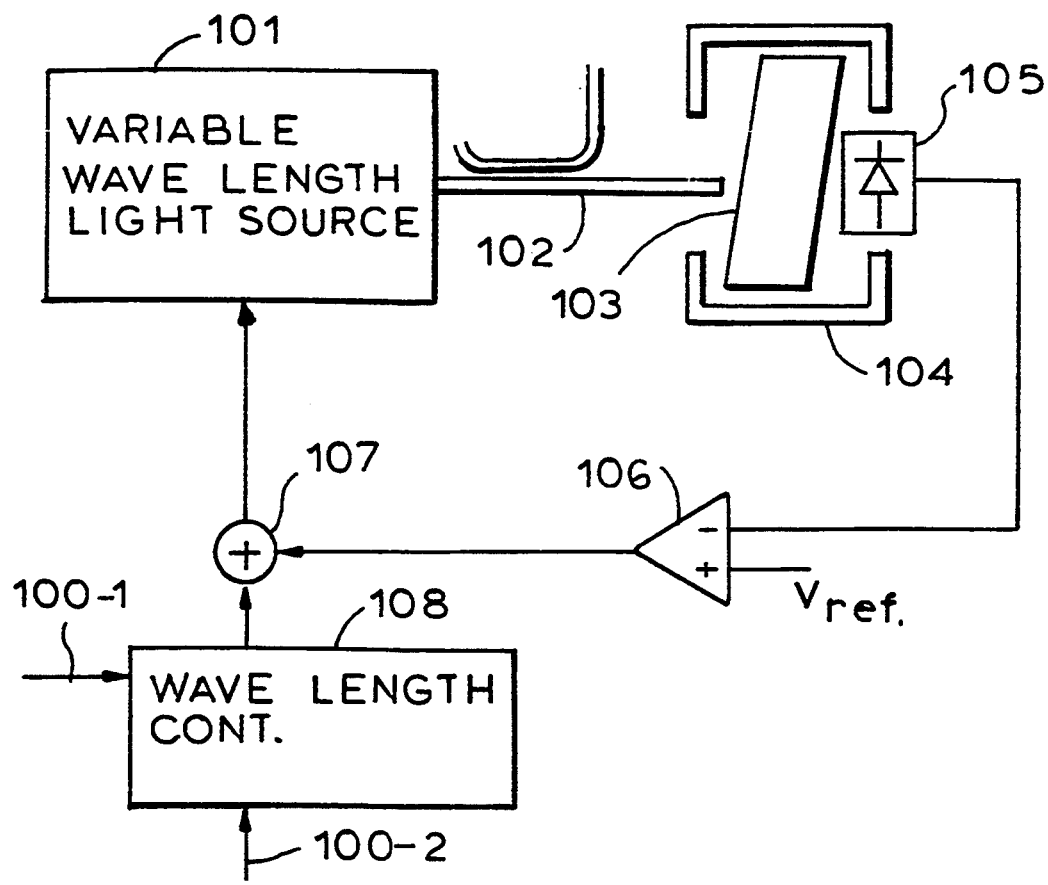
FIG. 1 is a block diagram illustrating a preferred embodiment of the present invention.

A preferred embodiment of the present invention will be described below with reference to FIG. 1. As shown in FIG. 1, the preferred embodiment of the invention consists of a variable-wavelength light source 101; a light brancher 102 for branching the output light of the variable-wavelength light source into two beams, of which one is supplied externally as an output light; an optical resonator 103, to which the other of the outputs of the light brancher 102 is supplied, for supplying transmitted light; a temperature control device 104 for accommodating the optical resonator 103; an optical detector 105 for outputting a voltage indicating the power of the transmitted light; an operational amplifier 106 for outputting, as a first wavelength control current, a current which is proportional to the balance of the subtraction of the output of the optical detector from a fixed reference voltage; a wavelength control circuit 108 for outputting a second wavelength control current in accordance with a wavelength switching signal 100-1 and a wavelength designation signal 100-2, both supplied from outside; and an adder 107 for adding the first wavelength control current signal and the second wavelength control signal to supply the result of addition to the variable-wavelength light source 101 as a wavelength control current.

The variable-wavelength light source 101 outputs oscillating light of a wavelength corresponding to the wavelength control current supplied from the adder 107. As this variable-wavelength light source can be used, for example, a DFB semiconductor laser. As is well known to those skilled in the art, a DFB semiconductor laser has such a property that its oscillating wavelength lengthens with an increase in injection current.

The oscillating light from the variable-wavelength light source 101 is branched by the light brancher 102 into two beams, of which one is emitted outside as output light and the other is brought to incidence on the optical resonator 103.

Figure 2:
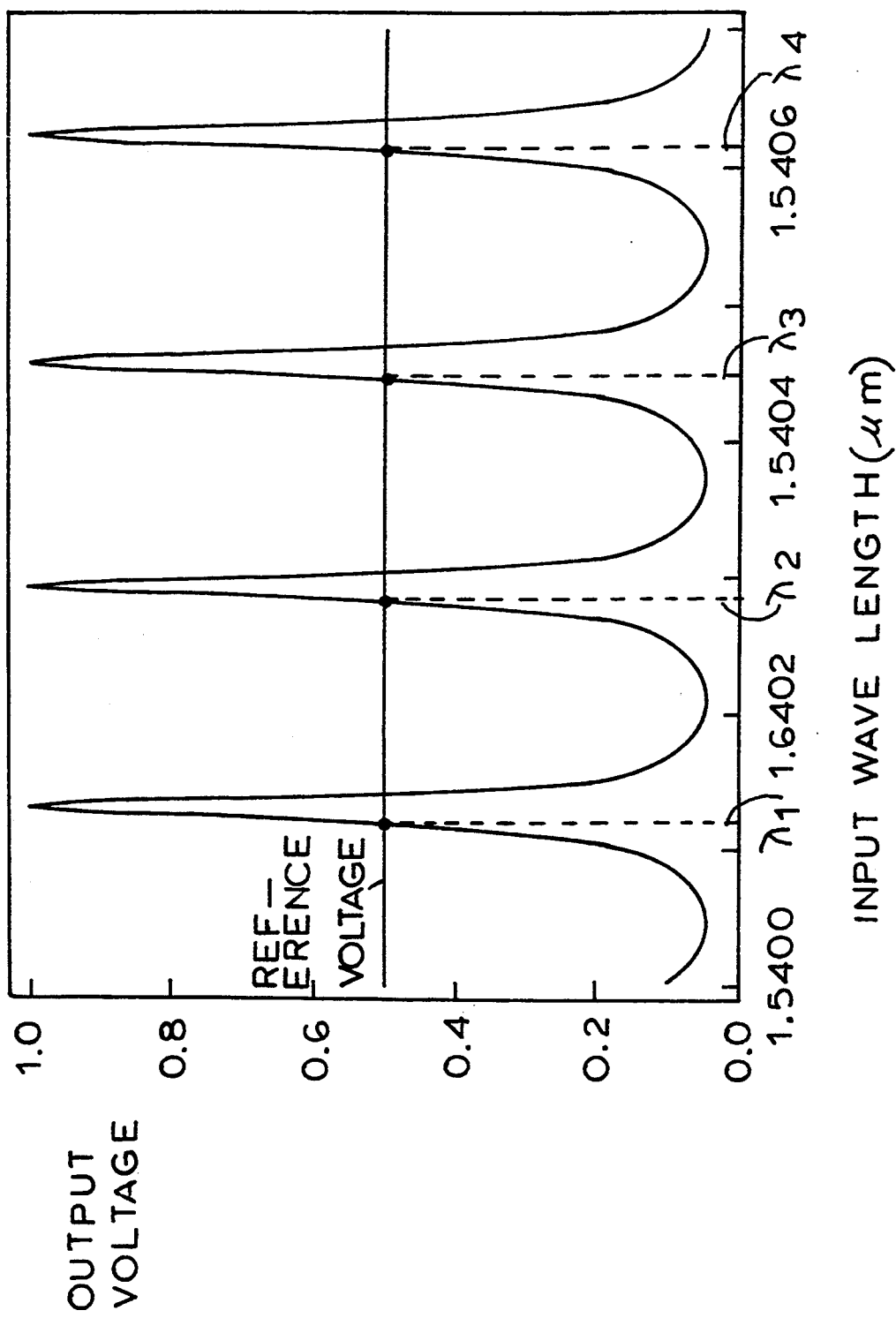
FIG. 2 is a diagram illustrating the wavelength transmitting characteristic of the optical resonator of FIG. 1.

As the optical resonator 103 can be used a Fabri-Perot etalon, for instance, which shows a periodic wavelength transmission characteristic as shown in FIG. 2. In FIG. 2, the horizontal axis represents the wavelength of the input light and the vertical axis, the relative volume of the detection voltage at the time of detecting the transmitted light power with an optical detector. As this optical resonator 103 can also be used a Machzender type optical resonator. This optical resonator 103 is housed in the temperature control device 104 and kept at a constant temperature. As is evident from FIG. 122, when the wavelength of the input light varies, the output voltage of the optical detector substantially varies in the rising and falling parts of the transmission characteristic. The intensity of this transmitted light is converted into a voltage by the optical detector 105.

The output voltage of the optical detector 105 is supplied to the negative side input terminal of the operational amplifier 106. On the other hand, the positive side input terminal of the operational amplifier is supplied with a fixed reference voltage. This reference voltage is set at a level corresponding to the mid-point between the peak level and the bottom level of the input wavelength-optical detector output voltage characteristic shown in FIG. 2. As shown in FIG. 2, wavelengths $\lambda_1$, $\lambda_2$, $\lambda_3$, $\lambda_4$, ..., corresponding to the intersection points between this reference voltage and the rising parts of the wavelength-output voltage characteristic are the oscillating wavelengths at which the variable-wavelength light source 101 is to be set. The operational amplifier 106 supplies, as the first wavelength control current, a current of a value proportional to the balance of the subtraction of the optical detector output voltage from the reference voltage. This first wavelength control current is supplied to one of the input terminals of the adder 107.

Here is considered a case in which the oscillating wavelength of the variable-wavelength light source 101 is set at the wavelength $\lambda_2$ in FIG. 2, when a current value $i(\lambda_2)$ to cause the variable wavelength light source 101 to oscillate at the wavelength $\lambda_2$ is supplied, as the second wavelength control current, from the wavelength control circuit 108 to a second input terminal of the adder 107. Thus the wavelength control circuit 108 outputs, as the second wavelength control current, a current of the value at which the variable-wavelength light source 1 oscillates at the wavelength $\lambda_2$ when the first wavelength control current is made zero.

If, in this case, the oscillating wavelength of the variable-wavelength light source 101 is lengthened by a temperature variation, the output voltage of the optical detector will increase as is obvious from FIG. 2, and a negative current is supplied from the operational amplifier 106. As a result, the wavelength control current, which is the output of the adder 107, will decrease, and the oscillating wavelength of the variable-wavelength light source 101 will shorten. Conversely, if the oscillating wavelength of the variable-wavelength light source 101 shortens, the output voltage of the optical detector 105 will decrease, the wavelength control current will increase, and the oscillating wavelength of the variable-wavelength light source 101 will lengthen. In this manner, the oscillating wavelength of the variable-light source 101 is stabilized at $\lambda_2$.

Figure 3:
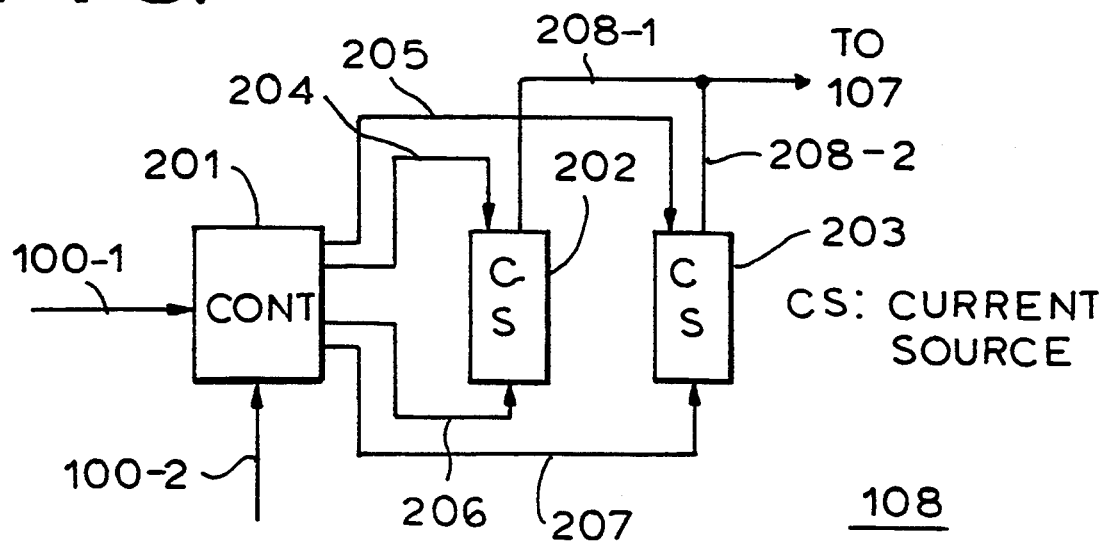
FIG. 3 is a block diagram illustrating the configuration of the wavelength control circuit 108 of FIG. 1.

The wavelength control circuit 108 will be described with reference to FIG. 3 as well. As shown in FIG. 3, the wavelength control circuit 108 consists of two current sources 202 and 203, of which one supplies the second wavelength control current when the other is in a hot stand-by state, and a control circuit 201. The control circuit 201, in accordance with the wavelength switching signal 100-1 supplied from outside, switches via signal lines 206 and 207 the current source in the hot stand-by state to an active state and the other current source, which is in the active state, to the hot stand-by state. The control circuit 201, in accordance with the wavelength designation signal 100-2 supplied from outside, further supplies the current source in the hot stand-by state with a bias voltage required for oscillating the variable wavelength light source 101 at the designated wavelength.

It is now supposed that the current source 202 is in an active state and the current source 203, in a hot stand-by state. Then the current source 202 supplies the adder 107 with an already set constant current, for instance $i(\lambda_2)$ mentioned above. And when a wavelength designation signal indicating the wavelength $\lambda_2$ is supplied via a signal line 100-2, the control circuit 201 supplies the current source 203 in the hot stand-by state via a signal line 205 with a bias voltage to cause the current $i(\lambda_2)$, which is required for having the variable-wavelength light source 101 oscillate at the wavelength $\lambda_2$, corresponding to this wavelength designation signal, to be outputted. After that, when the wavelength switching signal 100-1 is supplied to the control circuit 201, the current source 202 shifts to the hot standby state, and the current source 203 takes on the active state to supply the current $i(\lambda_2)$ to the adder 107.

Next will be described the configuration and operations of the constant current sources 202 and 203 with reference to FIG. 4. Since the two current sources are of the same configuration, only the current source 202 will be described.

Figure 4:
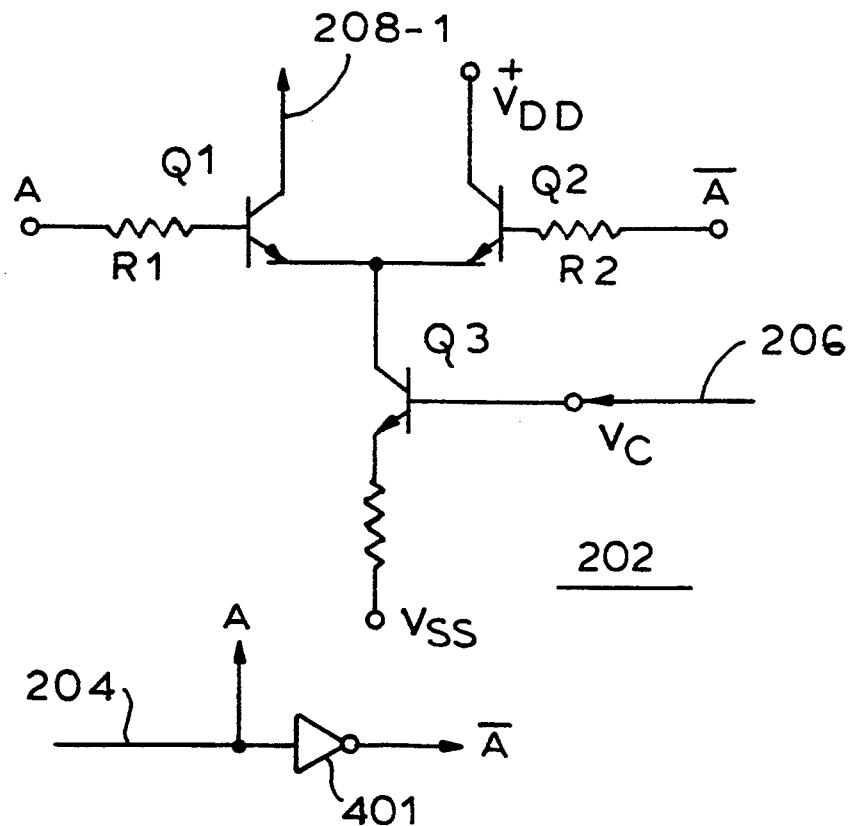
FIG. 4 is a circuit diagram illustrating the configuration of the constant current circuit of FIG. 2.

When the current source 202 of FIG. 4 is switched from the hot stand-by state to the active state, a signal line 204 supplies a signal which shifts from a low to a high level, and this signal is supplied via a terminal A and a resistor R1 to the base terminal of a switching transistor Q1. On the other hand, the base terminal of another switching transistor Q2 is supplied via an inverter 401 and a resistor R2 with a signal which shifts from a high to a low level. As a result, the transistor Q1 is turned on, and the transistor Q2, turned off. By that time, at the base terminal of still another Q3 will have been set a bias voltage Vc corresponding to the desired oscillating wavelength, this bias voltage having been supplied when the constant current source 202 was in the hot stand-by state. To a signal line 208-1 is outputted a current corresponding to the desired oscillating wavelength via the transistors Q1 and Q3, and this current is supplied to the adder 107 of FIG. 1.

Next, when the signal from the signal line 204 shifts from a high to a low level and the current source 202 takes on the hot stand-by state, the transistor Q1 is turned off and the transistor Q2, turned on. Then, as the current flows via the transistors Q2 and Q3 between power sources $+V_{DD}$ and $+V_{SS}$, the output current of the current source 202 is not supplied to the adder 107 of FIG. 1 and, as stated already, a bias voltage corresponding to the wavelength to be used when this current source 202 takes on an active state next time is set at the base terminal of the transistor Q3 via the signal line 206.

In this way, this preferred embodiment of the present invention requires no more than one optical resonator and one comparator for its temperature dependence stabilizing mechanism even if a large wavelength range is used, resulting in the advantage that the hardware dimensions will not enlarge.

Figure 5:
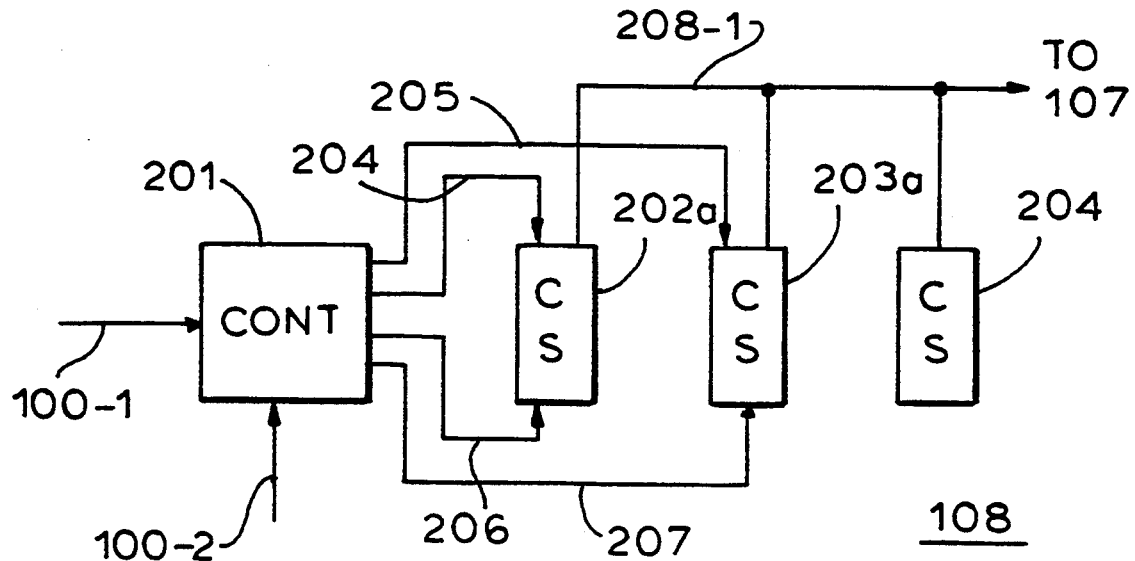
FIG. 5 is a block diagram illustrating another possible configuration of the wavelength control circuit 108.

FIG. 5 illustrates a second conceivable configuration of the wavelength control circuit 108. What differentiate the configuration of FIG. 5 from that of FIG. 3 are, first, that a constant current source 204, which outputs a fixed current value all the time, is newly provided here and, second, that the output current values of current sources 202a and 203a of FIG. 5 are smaller than those of the current sources 202 and 203 of FIG. 3 by the output current value of the constant current source 204. When wavelengths $\lambda_1, \lambda_2, \lambda_3, \lambda_4, \ldots$ of FIG. 2 are to be used as the oscillating wavelengths of the variable-wavelength light source, the wavelength control circuit of FIG. 3 requires not only the current source in the active state but also that in the hot stand-by state to supply at least a current corresponding to the wavelength $\lambda_1$. By contrast, in the wavelength control circuit of FIG. 5, the current value corresponding to the wavelength $\lambda_1$ is supplied by the constant current source 204, and the current sources 202a and 203a need to supply nothing more than the current value corresponding to the difference between the desired wavelength and the wavelength $\lambda_1$, so that this circuit consumes less power than that of FIG. 3.

What is claimed is:

1. A wavelength switching light source for varying the wavelength of output light in response to a wavelength designating signal and a wavelength switching signal, comprising:

a variable-wavelength light source whose oscillating wavelength varies in response to a wavelength control signal;

an optical resonator;

a light brancher for branching the output light of said variable-length light source into two beams, of which one is supplied as an output light and the other of said beams is provided to be incident on the optical resonator;

said optical resonator having a periodic wavelength transmitting characteristic and producing output light;

an optical detector for detecting power of the output light of said optical resonator and outputting an output value corresponding to said power;

means for outputting a first wavelength control signal comprising a signal proportional to balance of subtraction of said optical detector output value from a fixed value;

wavelength control means for outputting a second wavelength control signal required for causing said variable wavelength light source to oscillate at a designated wavelength in response to a wavelength designation signal and a wavelength switching signal; and adder means for adding said first wavelength control signal and said second wavelength control signal to output said wavelength control signal.

2. A wavelength switching light source, as claimed in claim 1, wherein said wavelength control means comprises:

two current sources, and a control ,circuit which places one of said two current sources in an active state to cause said second wavelength control signal to be supplied and the other of said current sources in a stand-by state in response to said wavelength control signal, and sets an output current value corresponding to said wavelength designation signal in the current source in the stand-by state.

3. A wavelength switching light source, as claimed in claim 2, wherein said optical resonator is housed in a temperature control device having an inside kept at a constant temperature.

4. A wavelength switching light source, as claimed in claim 3, wherein said optical resonator is a Fabry-Perot etalon.

5. A wavelength switching light source, as claimed in claim 2, wherein said wavelength control means is further provided with a constant current source which always supplies a fixed current value, and outputs as said second wavelength control signal a current resulting from the addition of the output current value of the current source in said active state and said fixed current value.

6. A wavelength switching light source, as claimed in claim 5, wherein said optical resonator is housed in a temperature control device having an inside kept at a constant temperature.

7. A wavelength switching light source, as claimed in claim 6, wherein said optical resonator is a Fabry-Perot etalon.

* * * * *